US011189342B2

(12) United States Patent
Aggarwal et al.

(10) Patent No.: US 11,189,342 B2
(45) Date of Patent: Nov. 30, 2021

(54) MEMORY MACRO AND METHOD OF OPERATING THE SAME

(71) Applicant: TAIWAN SEMICONDUCTOR MANUFACTURING COMPANY, LTD., Hsinchu (TW)

(72) Inventors: Pankaj Aggarwal, Zhudong Township (TW); Jui-Che Tsai, Tainan (TW); Ching-Wei Wu, Caotun Town (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/010,483

(22) Filed: Sep. 2, 2020

(65) Prior Publication Data

US 2020/0402571 A1 Dec. 24, 2020

Related U.S. Application Data

(62) Division of application No. 16/205,474, filed on Nov. 30, 2018, now Pat. No. 10,770,135, which is a (Continued)

(51) Int. Cl.
*G11C 11/419* (2006.01)
*G11C 11/418* (2006.01)
(Continued)

(52) U.S. Cl.
CPC .......... *G11C 11/419* (2013.01); *G11C 11/418* (2013.01); *G11C 7/1045* (2013.01);
(Continued)

(58) Field of Classification Search
CPC ..... G11C 29/4401; G11C 29/52; G11C 29/42; G11C 5/04; G11C 29/12; G11C 11/419;
(Continued)

(56) References Cited

U.S. PATENT DOCUMENTS 6,944,081 B2 9/2005 Takahashi
8,605,523 B2 12/2013 Tao et al.
(Continued)

OTHER PUBLICATIONS

Mano, M. Morris, Computer System Architecture, Englewood Clifs, N.J.: Prentice-Hall, Inc. 1982.

*Primary Examiner* — Jerome Leboeuf
(74) *Attorney, Agent, or Firm* — Hauptman Ham, LLP

(57) ABSTRACT

A method of operating a memory macro includes receiving a first signal indicating a first operational mode of the memory macro, receiving a second signal indicating a second operational mode of the memory macro, generating, by a first logic circuit, a third signal and a fourth signal based on the first signal and a fifth signal thereby causing a change in the first operational mode of the memory macro, and generating, by a second logic circuit, the fifth signal and a sixth signal based on at least the second signal and thereby causing a change in the second operational mode of the memory macro. The first logic circuit is coupled to a first memory cell array and a first IO circuit. The second logic circuit is coupled to a first and second set of word line driver circuits.

20 Claims, 7 Drawing Sheets

Related U.S. Application Data division of application No. 15/140,726, filed on Apr. 28, 2016, now Pat. No. 10,186,313.

(51) Int. Cl.
   *G11C 7/10* (2006.01)
   *G11C 7/18* (2006.01)

(52) U.S. Cl.
   CPC .......... *G11C 7/18* (2013.01); *G11C 2207/105* (2013.01); *G11C 2207/108* (2013.01)

(58) Field of Classification Search
   CPC ....... G11C 11/418; G11C 7/1045; G11C 7/18; G11C 2207/105; G11C 2207/108; G06F 11/1068; G06F 11/1048
   See application file for complete search history.

(56) References Cited

U.S. PATENT DOCUMENTS

| | | | |
|---|---|---|---|
| 8,630,132 B2 | 1/2014 | Cheng et al. | |
| 8,760,948 B2 | 6/2014 | Tao et al. | |
| 8,908,421 B2 | 12/2014 | Liaw | |
| 8,929,160 B2 | 1/2015 | Katoch et al. | |
| 8,964,492 B2 | 2/2015 | Hsu et al. | |
| 8,982,643 B2 | 3/2015 | Lum | |
| 9,117,510 B2 | 8/2015 | Yang et al. | |
| 9,208,858 B1 | 12/2015 | Lin et al. | |
| 9,218,872 B1 | 12/2015 | Liaw | |
| 2006/0092747 A1 | 5/2006 | Park | |
| 2007/0247952 A1 | 10/2007 | Watanabe et al. | |
| 2009/0046523 A1 | 2/2009 | Maki | |
| 2009/0213672 A1* | 8/2009 | Fukuda | G11C 7/1051 365/200 |
| 2012/0287741 A1 | 11/2012 | Ashizawa | |
| 2013/0286761 A1* | 10/2013 | Wang | G11C 5/148 365/226 |
| 2014/0119131 A1 | 5/2014 | Verma et al. | |
| 2014/0153345 A1 | 6/2014 | Kim et al. | |
| 2014/0233330 A1 | 8/2014 | Ko et al. | |
| 2015/0103576 A1 | 4/2015 | Wu et al. | |
| 2015/0348598 A1 | 12/2015 | Wang et al. | |
| 2015/0371702 A1 | 12/2015 | Wu et al. | |
| 2015/0380077 A1 | 12/2015 | Wu et al. | |
| 2015/0380078 A1 | 12/2015 | Liaw | |

* cited by examiner

| First Input Signal MS | Operational Mode |
|---|---|
| 0 | First (Normal) |
| 1 | Second (Half "ON") |

| First Input Signal MS | Second Input Signal QIO | Operational Mode | IO% |
|---|---|---|---|
| 0 | X | First (Normal) | 100 |
| 1 | 0 | Second (Half-operational or "ON") | 50 |
| 1 | 1 | Third (Quarter-operational or "ON") | 25 |

Fig. 3B

MEMORY MACRO AND METHOD OF OPERATING THE SAME

PRIORITY CLAIM

The present application is a divisional of U.S. application Ser. No. 16/205,474, filed Nov. 30, 2018, now U.S. Pat. No. 10,770,135, issued Sep. 8, 2020, which is a divisional of U.S. application Ser. No. 15/140,726, filed Apr. 28, 2016, now U.S. Pat. No. 10,186,313, issued Jan. 22, 2019, which are incorporated herein by reference in their entireties.

BACKGROUND

The semiconductor integrated circuit (IC) industry has produced a wide variety of digital devices to address issues in a number of different areas. Some of these digital devices, such as memory macros, are configured for the storage of data. As ICs have become smaller and more complex, operating voltages of these digital devices continues to decrease affecting IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3B is a table illustrating operational modes of the memory macro of FIG. 3A, in accordance with some embodiments.

DETAILED DESCRIPTION

Figure 1A:
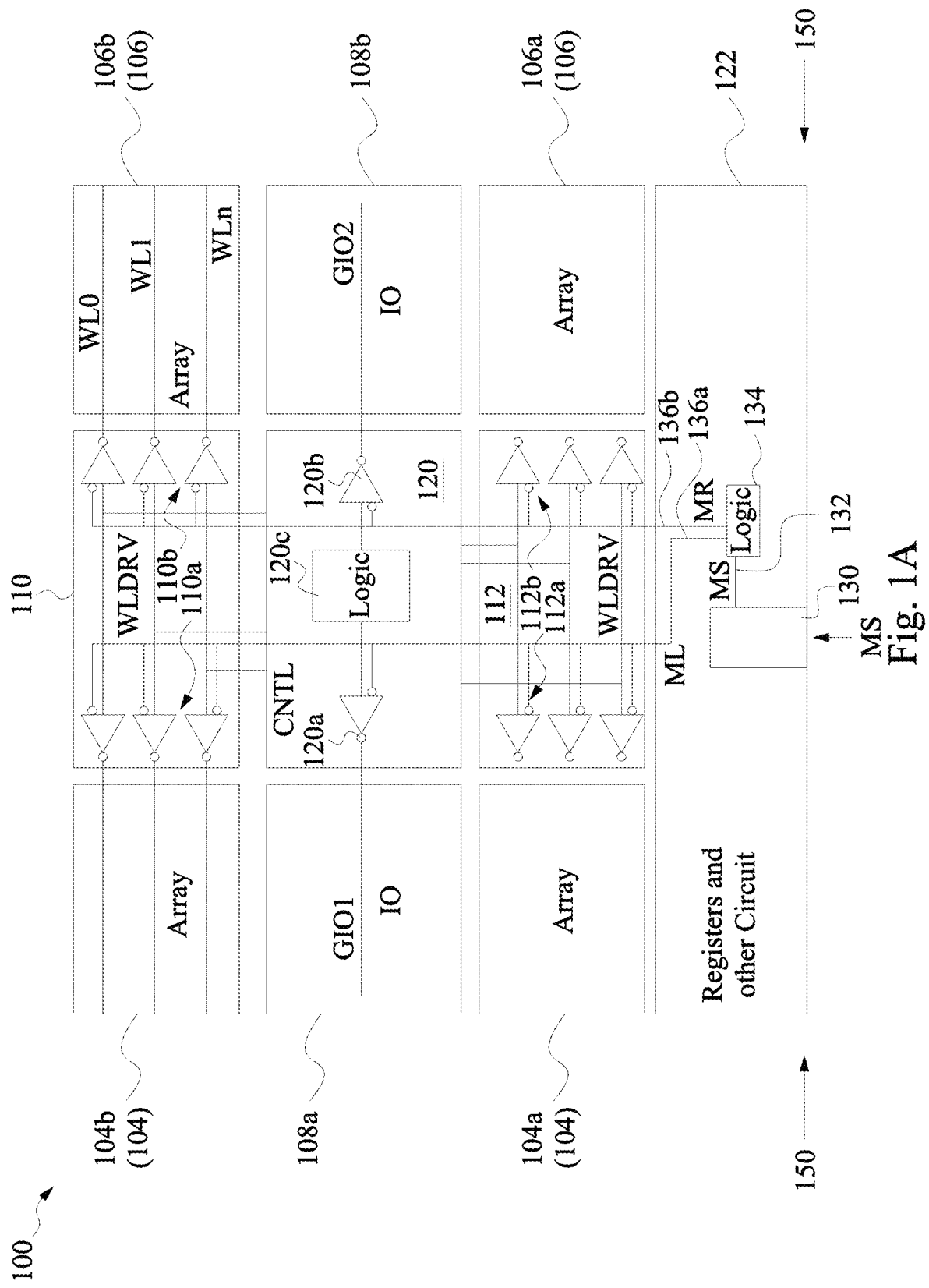
FIG. 1A is a block diagram of a memory macro, in accordance with some embodiments.

The following disclosure provides different embodiments, or examples, for implementing features of the provided subject matter. Specific examples of components and arrangements are described below to simplify the present disclosure. These are, of course, merely examples and are not limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory macro is configured to operate in a first mode or a second mode. The memory macro is configured to receive a first input signal that causes memory macro to be in a first or a second operational mode. In some embodiments, the first operational mode of the memory macro corresponds to a fully-operational mode that does not utilize an active power reduction scheme. In some embodiments, the second operational mode of the memory macro corresponds to a half-operational mode that uses an active power reduction scheme to reduce the operational power of the memory macro.

In accordance with some embodiments, a memory macro includes a first input terminal, a first memory cell array, a second memory cell array, a first input output (IO) circuit, a second IO circuit, a first set of driver circuits, a second set of driver circuits and a logic circuit. The first IO circuit is coupled to the first memory cell array and the second IO circuit is coupled to the second memory cell array. The first set of driver circuits is coupled to the first memory cell array and the first IO circuit. The second set of driver circuits is coupled to the second memory cell array and the second IO circuit. The logic circuit has a first terminal coupled to the first input terminal, and configured to receive a first signal. The logic circuit is coupled to the first set of driver circuits and the second set of driver circuits. The first signal indicates an operational mode of the memory macro. The logic circuit is configured to generate at least a second signal responsive to the first signal and wherein the second signal causes a change in the operational mode of the memory macro.

FIG. 1A is a block diagram of a memory macro 100, in accordance with some embodiments. In the embodiment of FIG. 1A, memory macro 100 is a static random access memory (SRAM) macro. SRAM is used for illustration, and other types of memories are within the scope of various embodiments.

Memory macro 100 is configured to receive a first input signal MS. First input signal MS is logically low or logically high. First input signal MS causes memory macro 100 to be in a first or a second operational mode. For example, a first value of the first input signal MS corresponds to the first operational mode of memory macro 100, and a second value of first input signal MS corresponds to the second operational mode of memory macro 100. First input signal MS is generated external of memory macro 100. Memory macro 100 is configured to generate a first signal ML and a second signal MR responsive to the first input signal MS causing a change in the operational mode of the memory macro 100. First signal ML or second signal MR is logically low or logically high.

Memory macro 100 includes a first memory cell array 104, a second memory cell array 106, a first IO circuit 108a, a second IO circuit 108b, a first driver circuit region 110, a second driver circuit region 112, a control circuit 120 and a register circuit 122.

Memory macro 100 is symmetrical. For example, with reference to first driver circuit region 110, second driver circuit region 112 and control circuit 120, circuit elements on the left side are similar to circuit elements on the right side of memory macro 100.

First memory cell array 104 is coupled to first driver circuit region 110 and second driver circuit region 112. First memory cell array 104 is also coupled to first IO circuit 108a (not shown). First memory cell array 104 is configured to store data. First memory cell array 104 is comprised of a first memory segment 104a and a second memory segment 104b. First memory segment 104a and second memory segment 104b each include a plurality of memory cells configured to store data. The memory cells in first memory segment 104a or second memory segment 104b are arranged in rows and columns. First memory segment 104a and second memory segment 104b are configured to share first IO circuit 108a.

Second memory cell array 106 is coupled to first driver circuit region 110 and second driver circuit region 112. Second memory cell array 106 is coupled to second IO circuit 108b (not shown). Second memory cell array 106 is configured to store data. Second memory cell array 106 is comprised of a first memory segment 106a and a second memory segment 106b. First memory segment 106a and second memory segment 106b each include a plurality of memory cells configured to store data. The memory cells in first memory segment 106a or second memory segment 106b are arranged in rows and columns. First memory segment 106a and second memory segment 106b are configured to share second IO circuit 108b. First memory segment 104a and first memory segment 106a are configured to share second driver circuit region 112. Second memory segment 104b and second memory segment 106b are configured to share first driver circuit region 110.

First IO circuit 108a is coupled to first memory segment 104a and second memory segment 104b by data lines (not shown). First IO circuit 108a is also coupled to control circuit 120 by a first global IO line GIO1. First IO circuit 108a is configured to read data from and write data to the first memory cell array 104 by data lines (not shown). First IO circuit 108a is configured to receive control signals from control circuit 120 by first global IO line GIO1. First IO circuit 108a includes multiplexers, sense amplifiers, input drivers or output drivers.

Second IO circuit 108b is coupled to first memory segment 106a and second memory segment 106b by data lines (not shown). Second IO circuit 108b is also coupled to control circuit 120 by a second global IO line GIO2. Second IO circuit 108b is configured to read data from and write data to the second memory cell array 106 by data lines (not shown). Second IO circuit 108b is configured to receive control signals from control circuit 120 by second global IO line GIO2. Second IO circuit 108b includes multiplexers, sense amplifiers, input drivers or output drivers.

First driver circuit region 110 is coupled to second memory segment 104b, second memory segment 106b, control circuit 120 and first logic circuit 134. First driver circuit region 110 is between second memory segment 104b and second memory segment 106b. First driver circuit region 110 is configured to receive first signal ML, second signal MR and control signals (not shown). In some embodiments, the control signals (not shown) correspond to word line data. First driver circuit region 110 is configured to output word line signals (not shown) on word lines WL0, . . . , WLn (where n is an integer corresponding to the number of word lines). First driver circuit region 110 includes a first set of word line drivers 110a and a second set of word line drivers 110b.

First set of word line drivers 110a is configured to receive first signal ML and control signals (not shown). First set of word line drivers 110a is configured to generate word line signals (not shown) on word lines WL0, . . . , WLn connected to the second memory segment 104b based on first signal ML and control signals (not shown). First set of word line drivers 110a is configured to be turned on or off based on first signal ML. First set of word line drivers 110a includes one or more word line driver circuits that have an inverted enable input. In some embodiments, first set of word line drivers 110a includes one or more word line driver circuits that have a non-inverted enable input.

Second set of word line drivers 110b is configured to receive second signal MR and control signals (not shown). Second set of word line drivers 110b is configured to generate word line signals (not shown) on word lines WL0, . . . , WLn connected to the second memory segment 106b based on second signal MR and control signals (not shown). Second set of word line drivers 110b is configured to be turned on or off based on second signal MR. Second set of word line drivers 110b includes one or more word line driver circuits that have an inverted enable input. In some embodiments, second set of word line drivers 110b includes one or more word line driver circuits that have a non-inverted enable input.

Second driver circuit region 112 is coupled to first memory segment 104a, first memory segment 106a, control circuit 120 and first logic circuit 134. Second driver circuit region 112 is between first memory segment 104a and first memory segment 106a. Second driver circuit region 112 is configured to receive first signal ML, second signal MR and control signals (not shown). Second driver circuit region 112 is configured to output word line signals (not shown) on word lines (not shown). Second driver circuit region 112 includes a first set of word line drivers 112a and a second set of word line drivers 112b. First driver circuit region 110 and second driver circuit region 112 are configured to share control circuit 120.

First set of word line drivers 112a is configured to receive first signal ML and control signals (not shown). First set of word line drivers 112a is configured to generate word line signals (not shown) on word lines (not shown) connected to the first memory segment 104a based on first signal ML and control signals (not shown). First set of word line drivers 112a is configured to be turned on or off based on first signal ML. First set of word line drivers 112a includes one or more word line driver circuits that have an inverted enable input. In some embodiments, first set of word line drivers 112a includes a plurality of word line driver circuits that have a non-inverted enable input. When first set of word line drivers 110a and first set of word line drivers 112a are turned off based on first signal ML, data stored in first memory cell array 104 is retained.

Second set of word line drivers 112b is configured to receive second signal MR and control signals (not shown). Second set of word line drivers 112b is configured to generate word line signals (not shown) on word lines (not shown) connected to the first memory segment 106a based on second signal MR and control signals (not shown). Second set of word line drivers 112b is configured to be turned on or off based on second signal MR. Second set of word line drivers 112b includes one or more word line driver circuits that have an inverted enable input. In some embodiments, second set of word line drivers 112b includes a plurality of word line driver circuits that have a non-inverted enable input. When second set of word line drivers 110b and second set of word line drivers 112b are turned off based on second signal MR, data stored in second memory cell array 106 is retained.

Control circuit 120 is coupled to first IO circuit 108a, second IO circuit 108b, first driver circuit region 110 and second driver circuit region 112. Control circuit 120 is configured to control reading data from and writing data to the first memory cell array 104 and the second memory cell array 106. Control circuit 120 is configured to control first IO circuit 108a by first global IO line GIO1. Control circuit 120 is configured to control second IO circuit 108b by second global IO line GIO2. Control circuit 120 is between first driver circuit region 110 and second driver circuit region 112. Control circuit 120 is between first IO circuit 108a and second IO circuit 108b. Control circuit 120 includes a first set of control driver circuit 120a, a second set of control driver circuits 120b and control logic circuit 120c.

First set of control driver circuits 120a is coupled to first logic circuit 134 by second terminal 136a and to first IO circuit 108a by first global IO line GIO1. First set of control driver circuits 120a is configured to receive first signal ML and control signals (not shown). First set of control driver circuits 120a is configured to generate control signals (not shown) on first global IO line GIO1 based on first signal ML and control signals (not shown) received from control circuit 120. First set of control driver circuits 120a is configured to be turned on or off based upon the first signal ML. First set of control driver circuits 120a includes one or more control driver circuits that have an inverted enable input. In some embodiments, first set of control driver circuits 120a includes one or more control driver circuits that have a non-inverted enable input. When first set of control driver circuits 120a are turned off based on first signal ML, data stored in first IO circuit 108a is retained.

Second set of control driver circuits 120b is coupled to first logic circuit 134 by third terminal 136b and to second IO circuit 108b by second global IO line GIO2. Second set of control driver circuits 120b is configured to receive second signal MR and control signals (not shown). Second set of control driver circuits 120b is configured to generate control signals (not shown) on second global IO line GIO2 based on second signal MR and control signals (not shown) received from control circuit 120. Second set of control driver circuits 120b is configured to be turned on or off based upon the second signal MR. Second set of control driver circuits 120b includes one or more control driver circuits that have an inverted enable input. In some embodiments, second set of control driver circuits 120b includes one or more control driver circuits that have a non-inverted enable input. When second set of control driver circuits 120b are turned off based on second signal MR, data stored in second IO circuit 108b is retained.

Control logic circuit 120c is configured to generate control signals (not shown) utilized by control circuit 120 to control first IO circuit 108a and second IO circuit 108b. Control logic circuit 120c is coupled to first set of control driver circuits 120a and second set of control driver circuits 120b. Control logic circuit 120c is configured to send control signals (not shown) to first set of control driver circuits 120a and second set of control driver circuits 120b.

Register circuit 122 is coupled to first driver circuit region 110, second driver circuit region 112 and control circuit 120. Register circuit 122 is configured to receive first input signal MS. Register circuit 122 is configured to generate first signal ML and second signal MR responsive to the first input signal MS causing a change in an operational mode of the memory macro 100. Register circuit 122 is located along an edge of memory macro 100. In some embodiments, register circuit 122 is located in other regions of memory macro 100.

Register circuit 122 includes a first terminal 130 and a first logic circuit 134. In some embodiments, register circuit 122 also includes input pins/terminals or output pins/terminals configured to send or receive data to or from memory macro 100. In some embodiments, register circuit 122 also includes flip-flops, latches or output registers configured to store data.

First terminal 130 is coupled to first logic circuit 134. First terminal 130 is configured to receive first input signal MS. First terminal 130 is configured to transfer first input signal MS to first logic circuit 134. First terminal 130 is an input terminal or an output terminal. In some embodiments, first terminal 130 is an input pin or an output pin. First terminal 130 is located along an edge 150 of memory macro 100. In some embodiments, first terminal 130 is located in other regions of memory macro 100.

First logic circuit 134 is coupled to first terminal 130, first driver circuit region 110, second driver circuit region 112 and control circuit 120. First logic circuit 134 is configured to receive first input signal MS. First logic circuit 134 is configured to generate first signal ML and second signal MR responsive to the first input signal MS, and first signal ML and second signal MR cause a change in an operational mode of the memory macro 100. In some embodiments, a change in an operational mode of the memory macro 100 includes a change in an operational mode of the first driver circuit region 110 or the second driver circuit region 112. In some embodiments, a change in an operational mode of the memory macro 100 includes a change in an operational mode of the first set of word line drivers 110a and the first set of word line drivers 112a. In some embodiments, a change in an operational mode of the memory macro 100 includes a change in an operational mode of the second set of word line drivers 110b and the second set of word line drivers 112b. In some embodiments, a change in an operational mode of the memory macro 100 includes a change in an operational mode of the first set of control driver circuits 120a or the second set of control driver circuits 120b. In some embodiments, a change in an operational mode of the memory macro 100 includes a change in an operational mode of the first IO circuit 108a or the second IO circuit 108b.

First logic circuit 134 includes a first terminal 132, a second terminal 136a and a third terminal 136b. First terminal 132 is coupled to first terminal 130, and is configured to receive first input signal MS. Second terminal 136a is coupled to first driver circuit region 110, second driver circuit region 112 and control circuit 120, and is configured to output first signal ML. Third terminal 136b is coupled to first driver circuit region 110, second driver circuit region 112 and control circuit 120, and is configured to output second signal MR.

Memory macro 100 is configured to operate in a first mode or a second mode. In some embodiments, the first mode of memory macro 100 corresponds to a fully-operational mode that does not employ an active power reduction scheme. For example, in the first mode of memory macro 100, each of the first set of control driver circuits 120a, the first set of word line drivers 112a and the first set of word line drivers 110a are turned on by first signal ML, and each of the second set of control driver circuits 120b, the second set of word line drivers 112b and the second set of word line drivers 110b are turned on by second signal MR.

In some embodiments, the second mode of memory macro 100 corresponds to a half-operational mode that uses an active power reduction scheme. In some embodiments, the second mode of memory macro 100 corresponds to memory macro 100 utilizing 50% of the power when compared with the first mode.

For example, in some embodiments, the second mode of memory macro 100 corresponds to the driver circuits (e.g., first set of control driver circuits 120a, the first set of word line drivers 112a and the first set of word line drivers 110a) on the left side of memory macro 100 being turned on by first signal ML, and the driver circuits (e.g., second set of control driver circuits 120b, the second set of word line drivers 112b and the second set of word line drivers 110b) on the right side of memory macro 100 being turned-off by second signal MR.

For example, in some other embodiments, the second mode of memory macro 100 corresponds to the driver circuits (e.g., first set of control driver circuits 120a, the first set of word line drivers 112a and the first set of word line drivers 110a) on the left side of memory macro 100 being turned-off by first signal ML, and the driver circuits (e.g., second set of control driver circuits 120b, the second set of word line drivers 112b and the second set of word line drivers 110b) on the right side of memory macro 100 being turned on by second signal MR.

Figure 1B:
FIG. 1B is a table illustrating operational modes of the memory macro of FIG. 1A, in accordance with some embodiments.

FIG. 1B is a table 100' illustrating the operational modes of memory macro 100 of FIG. 1A, in accordance with some embodiments.

Table 100' comprises 2 rows and 2 columns of data. The first column comprises a plurality of possible entries for first input signal MS. The second column comprises a plurality of second entries for operational modes corresponding to a particular entry in the first column.

For example, in row 1, when first input signal MS is logically low, memory macro 100 is in the first operational mode. In some embodiments, the first operational mode of memory macro 100 corresponds to a normal or fully-operational mode that does not employ an active power reduction scheme.

For example, in row 2, when first input signal MS is logically high, memory macro 100 is in the second operational mode. In some embodiments, the second operational mode of memory macro 100 corresponds to a half-operational mode that uses an active power reduction scheme to reduce the operational power of memory macro 100 by 50% of the power when compared with the first operational mode. In some embodiments, the half-operational mode corresponds to a left portion of memory macro 100 being turned off and a right portion of memory macro 100 being turned on. In some embodiments, the half-operational mode corresponds to the right portion of memory macro 100 being turned off and the left portion of memory macro 100 being turned on.

Table 100' is used for illustration. Other values for first input signal MS and the corresponding operational modes are within the contemplated scope of the present disclosure. In some embodiments, when first input signal MS is logically high, memory macro 100 is in the first operational mode. In some embodiments, when first input signal MS is logically low, memory macro 100 is in the second operational mode.

Figure 2:
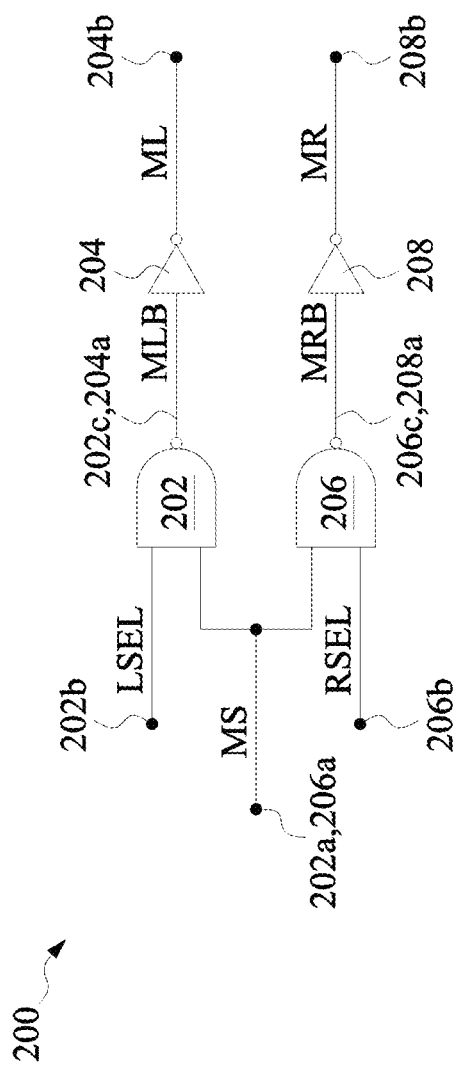
FIG. 2 is a circuit diagram of a first logic circuit usable in FIG. 1A, in accordance with some embodiments.
Figure 3A:
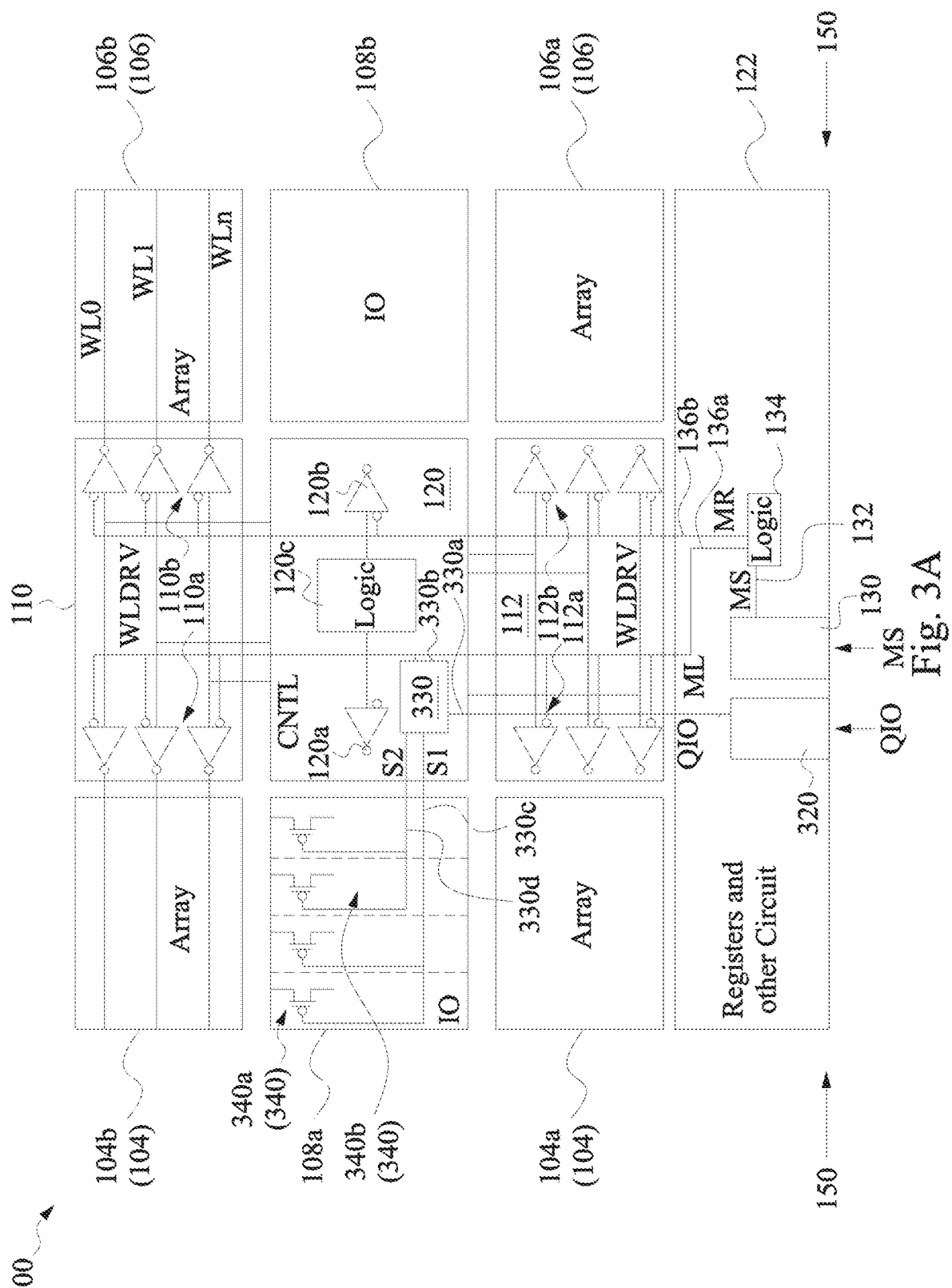
FIG. 3A is a block diagram of another memory macro, in accordance with some embodiments.

FIG. 2 is a circuit diagram of a first logic circuit 200 usable as the first logic circuit 134 of FIG. 1A or FIG. 3A, in accordance with some embodiments.

First logic circuit 200 comprises a first NAND gate 202 coupled to a first inverter 204 and a second NAND gate 206 coupled to a second inverter 208.

First logic circuit 200 is configured to receive first input signal MS, a first memory signal LSEL and a second memory signal RSEL. First logic circuit 200 is configured to generate first signal ML and second signal MR based on first input signal MS, a first memory signal LSEL and a second memory signal RSEL.

First NAND gate 202 has a first terminal 202a configured to receive the first input signal MS. First terminal 202a of first NAND gate 202 is an embodiment of first terminal 132 of first logic circuit (FIG. 1A). First NAND gate 202 has a second terminal 202b configured to receive the first memory signal LSEL. First memory signal LSEL is logically low or logically high. In some embodiments, first memory signal LSEL is an internal memory signal of memory macro 100. First NAND gate 202 has a third terminal 202c coupled to an input terminal 204a of first inverter 204, and configured to generate a first signal MLB based on first input signal MS and first memory signal LSEL.

First inverter 204 has a first terminal 204a configured to receive first signal MLB. First inverter 204 has a second terminal 204b configured to output first signal ML. First signal ML is an inverted version of first signal MLB. Second terminal 204b of first inverter 204 is an embodiment of second terminal 136a of first logic circuit (FIG. 1A).

Second NAND gate 206 has a first terminal 206a configured to receive the first input signal MS. First terminal 206a of second NAND gate 206 is an embodiment of first terminal 132 of first logic circuit (FIG. 1A). Second NAND gate 206 has a second terminal 206b configured to receive the second memory signal RSEL. Second memory signal RSEL is logically low or logically high. In some embodiments, second memory signal RSEL is an internal memory signal of memory macro 100. Second NAND gate 206 has a third terminal 206c coupled to an input terminal 208a of second inverter 208, and configured to generate a second signal MRB based on first input signal MS and second memory signal RSEL.

Second inverter 208 has a first terminal 208a configured to receive second signal MRB. Second inverter 208 has a second terminal 208b configured to output second signal MR. Second signal MR is an inverted version of second signal MRB. Second terminal 208b of second inverter 208 is an embodiment of third terminal 136b of first logic circuit (FIG. 1A).

FIG. 3A is a block diagram of another memory macro 300, in accordance with some embodiments. Memory macro 300 is an embodiment of memory macro 100 (FIG. 1A). Components that are the same or similar to those in FIG. 1A are given the same reference numbers, and detailed description thereof is thus omitted.

Memory macro 300 is configured to operate in a first mode, a second mode or a third mode. In some embodiments, the first mode of memory macro 300 corresponds to a fully-operational mode that does not utilize an active power reduction scheme. In some embodiments, the second mode of memory macro 300 corresponds to a half-operational mode that uses an active power reduction scheme to reduce the operational power of memory macro 300. In some embodiments, the third mode of memory macro 300 corresponds to a quarter-operational mode that uses an active power reduction scheme to reduce the operational power of memory macro 300.

Memory macro 300 is configured to receive first input signal MS and a second input signal QIO. Second input signal QIO is logically low or logically high. For memory macro 300, first input signal MS and second input signal QIO indicate the first, second or third operational mode of memory macro 300. Second input signal QIO is generated outside of memory macro 300. Memory macro 300 is configured to generate a first output signal S1 and a second output signal S2 responsive to at least the second input signal QIO. In some embodiments, when the second or half-power operational mode is selected by first input signal MS, second input signal QIO causes a change in the operational mode of memory macro 300. First output signal S1 or second output signal S2 is logically low or logically high. In comparison with FIG. 1A, memory macro 300 also includes a second terminal 320, a second logic circuit 330 and a set of transistors 340.

In comparison with FIG. 1A, register circuit 122 of memory macro 300 includes second terminal 320. In comparison with FIG. 1A, control circuit 120 of memory macro 300 includes second logic circuit 330. In comparison with FIG. 1A, first IO circuit 108a of memory macro 300 includes set of transistors 340.

Second terminal 320 is coupled to second logic circuit 330. Second terminal 320 is configured to receive second input signal QIO. Second terminal 320 is configured to output second input signal QIO to second logic circuit 330. Second terminal 320 is an input terminal or an output terminal. In some embodiments, second terminal 320 is an input pin or an output pin. Second terminal 320 is located along edge 150 of memory macro 300. In some embodiments, second terminal 320 is located in other regions of memory macro 300.

Second logic circuit 330 is coupled to first logic circuit 134, second input terminal 320 and first IO circuit 108a. Second logic circuit 330 is configured to receive second input signal QIO and first signal ML. Second logic circuit 330 is configured to generate first output signal S1 and second output signal S2 responsive to first signal ML and second input signal QIO causing a change in an operational mode of the memory macro 300. In some embodiments, the change in the operational mode of memory macro 300 comprises turning off the second IO circuit 108b and turning off 50% of the first IO circuit 108a. In these embodiments, data in the first IO circuit 108a and the second IO circuit 108b is retained. In some embodiments, when the second or half-power operational mode is selected by first input signal MS, second input signal QIO causes a change in the operational mode of the first IO circuit 108a.

Second logic circuit 330 is configured to turn off or on first IO circuit 108a. Second logic circuit 330 is configured to turn off or on the first set of transistors 340a based on first output signal S1. Second logic circuit 330 is configured to turn off or on the second set of transistors 340b based on second output signal S2.

Second logic circuit 330 has a first input terminal 330a, a second input terminal 330b, a first output terminal 330c, and a second output terminal 330d. The first input terminal 330a of second logic circuit 330 is coupled to the second terminal 320. The first input terminal 330a of the second logic circuit 330 is configured to receive a second input signal QIO. The second input terminal 330b of the second logic circuit 330 is coupled to second terminal 136a of first logic circuit 134. The second input terminal 330b of the second logic circuit 330 is configured to receive first signal ML. The first output terminal 330c of second logic circuit 330 is coupled to the first set of transistors 340a. The first output terminal 330c of the second logic circuit 330 is configured to output first output signal S1. The second output terminal 330d of the second logic circuit 330 is coupled to second set of transistors 340b. The second output terminal 330d of the second logic circuit 330 is configured to output second output signal S2.

Set of transistors 340 are configured to receive first output signal S1 and second output signal S2. Set of transistors 340 are configured to be turned off or on based on first output signal S1 and second output signal S2. Set of transistors 340 are coupled to second memory segment 104b and second logic circuit 330. Set of transistors 340 is comprised of a first set of transistors 340a and a second set of transistors 340b.

The first set of transistors 340a is coupled to second memory segment 104b and second logic circuit 330. The first set of transistors 340a is configured to receive the first output signal S1 causing the first set of transistors 340a to be turned off or on. The first set of transistors 340a includes one or more P-type Metal Oxide Semiconductor (PMOS) transistors. In some embodiments, the first set of transistors 340a includes one or more N-type Metal Oxide Semiconductor (NMOS) transistors.

The second set of transistors 340b is coupled to the second memory segment 104b and the second logic circuit 330. The second set of transistors 340b is configured to receive the second output signal S2 causing the second set of transistors 340b to be turned off or on. The second set of transistors 340b includes one or more PMOS transistors. In some embodiments, the second set of transistors 340b includes one or more NMOS transistors.

In some embodiments, when the second or half-power operational mode is selected by first input signal MS and second input signal QIO, the first set of transistors 340a and the second set of transistors 340b are turned on. In some embodiments, when the third or quarter-power operational mode is selected by first input signal MS and second input signal QIO, one of the first set of transistors 340a or the second set of transistors 340b is turned on, and the other of the first set of transistors 340a or the second set of transistors 340b is turned off.

FIG. 3A is used for illustration. Other arrangements for second logic circuit 330, second IO circuit 108b, or set of transistors 340 are within the contemplated scope of the present disclosure. For example, in some embodiments, second logic circuit 330 or set of transistors 340 are located on the right side of memory macro 300. In this example, the second input terminal 330b of the second logic circuit 330 is coupled to third terminal 136b of first logic circuit 134. In this example, the second input terminal 330b of the second logic circuit 330 is configured to receive second signal MR. In this example, set of transistors 340 is located in the second IO circuit 108b. In this example, the first set of transistors 340a and the second set of transistors 340b are coupled to second memory segment 106b. In this example, when the second or half-power operational mode is selected by first input signal MS, second input signal QIO causes a change in the operational mode of the second IO circuit 108b. For example, an additional set of transistors (similar to the set of transistors 340) is located above second memory segment 104b. In this example, the additional set of transistors (similar to the set of transistors 340) is utilized to lower the power level provided to the second memory segment 104b without impacting the retention of data stored in memory cells of the second memory segment 104b.

Memory macro 100 (FIG. 1A) or memory macro 300 (FIG. 3A) occupies less area than other memory macro circuits (not utilizing the features of memory macro 100 or memory macro 300) that also have active power reduction techniques. The area of memory macro 100 (FIG. 1A) or memory macro 300 (FIG. 3A) is increased by 1% to 2% when compared with other memory macro circuits (not utilizing the features of memory macro 100 or memory macro 300), but the circuit modifications/design changes of memory macro 100 or memory macro 300 are reduced when compared with other memory macro circuits having active power reduction techniques (e.g., floating bit lines which require a number of circuit modifications to the memory macro). Furthermore, the active power reduction techniques of memory macro 100 (FIG. 1A) or memory macro 300 (FIG. 3A) does not affect normal memory performance unlike other memory macro circuits (not utilizing the features of memory macro 100 or memory macro 300).

Memory macro 100 (FIG. 1A) or memory macro 300 (FIG. 3A) has less circuit modifications than other memory macro circuits (not utilizing the features of memory macro 100 or memory macro 300) that also have active power reduction techniques.

FIG. 3B is a table 300' illustrating the operational modes of memory macro 300 of FIG. 3A, in accordance with some embodiments.

Table 300' comprises 3 rows and 4 columns of data. The first column comprises a plurality of entries for first input signal MS. The second column comprises a plurality of entries for second input signal QIO. The third column comprises a plurality of second entries for operational modes. The fourth column comprises a plurality of second entries for IO percentage (e.g., 10%).

For example, in row 1, when first input signal MS is logically low, memory macro 300 is in the first operational mode regardless of the logical state of second input signal QIO. In some embodiments, the first operational mode of memory macro 300 corresponds to a normal or fully-operational mode that does not employ an active power reduction scheme and therefore the IO percentage for row 1 is 100%. In this embodiment, the first IO circuit 108a and the second IO circuit 108b are both operational.

For example, in row 2, when first input signal MS is logically high and second input signal QIO is logically low, memory macro 300 is in the second operational mode. In some embodiments, the second operational mode of memory macro 300 corresponds to a half-operational mode that uses an active power reduction scheme to reduce the operational power of the IO circuits (e.g., first IO circuit 108a or second IO circuit 108b) of memory macro 300 by 50% of the power when compared with the first operational mode. In this embodiment, the IO percentage for row 2 is 50%. In this embodiment, one of the first IO circuit 108a or the second IO circuit 108b is operational (e.g., turned on), and the other of the first IO circuit 108a or the second IO circuit 108b is not operational (e.g., turned-off).

For example, in row 3, when first input signal MS is logically high and second input signal QIO is logically high, memory macro 300 is in the third operational mode. In some embodiments, the third operational mode of memory macro 300 corresponds to a quarter-operational mode that uses an active power reduction scheme to reduce the operational power of the IO circuits (e.g., first IO circuit 108a or second IO circuit 108b) of memory macro 300 by 75% of the power when compared with the first operational mode. In this embodiment, the IO percentage for row 3 is 25% indicating that the operational power of the IO circuits (e.g., first IO circuit 108a or second IO circuit 108b) of memory macro 300 is 25% of the power when compared with the first operational mode. For example, in this embodiment, one of the first IO circuit 108a or the second IO circuit 108b is partially operational, and the other of the first IO circuit 108a or the second IO circuit 108b is not operational (e.g., turned-off). In this embodiment, the partially operational IO circuit has a first portion of first IO circuit 108a or second IO circuit 108b turned on, and a second portion of corresponding first IO circuit 108a or corresponding second IO circuit 108b turned-off. For example, if the first IO circuit 108a is partly operational, then the second IO circuit 108b is not operational (e.g., turned off). In this example, first circuit 108a has a first portion that is operational (e.g., turned on), and a second portion that is not operational (turned off).

Table 300' is used for illustration. Other values for first input signal MS, second input signal QIO or the corresponding operational modes are within the contemplated scope of the present disclosure. For example, other values for first input signal MS and the corresponding operational modes are within the contemplated scope of the present disclosure.

In some embodiments, when first input signal MS is logically high, memory macro 100 is in the first operational mode regardless of the logical state of second input signal QIO. In some embodiments, when first input signal MS is logically low, memory macro 100 is in the second or third operational mode. For example, other values for second input signal QIO and the corresponding operational modes are within the contemplated scope of the present disclosure.

Figure 4:
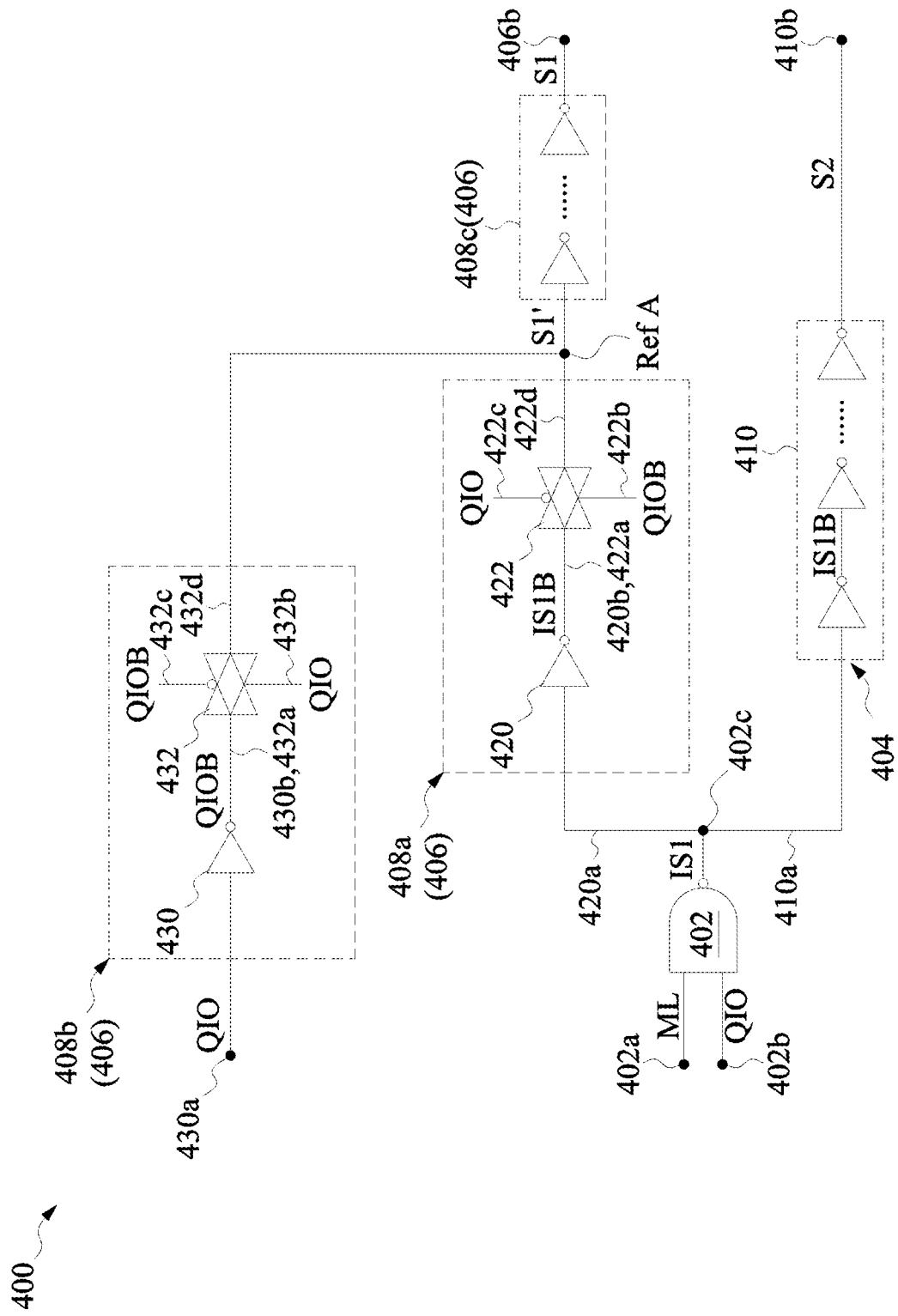
FIG. 4 is a circuit diagram of a second logic circuit usable in FIG. 3A, in accordance with some embodiments.

FIG. 4 is a circuit diagram of a second logic circuit 400 usable as the second logic circuit 330 of FIG. 3A, in accordance with some embodiments.

Second logic circuit 400 comprises a first NAND gate 402 coupled to a first path 404 and a second path 406. Second logic circuit 400 is configured to receive first signal ML and second input signal QIO. Second logic circuit 400 is configured to generate first output signal S1 and second output signal S2 based on first signal ML and second input signal QIO.

First NAND gate 402 has a first terminal 402a configured to receive the first signal ML. First NAND gate 402 has a second terminal 402b configured to receive the second input signal QIO. First NAND gate 402 has a third terminal 402c coupled to first path 404 and second path 406, and configured to generate a first intermediate signal IS1 based on first signal ML and second input signal QIO.

First path 404 is configured to receive first intermediate signal IS1, and to output second output signal S2 based on first intermediate signal IS1. First path 404 includes a first plurality of inverters 404 configured to generate second output signal S2 based on first intermediate signal IS1. First plurality of inverters 404 includes N inverters coupled in series, where N is an odd integer equal to or greater than 1.

Second path 406 is configured to receive first intermediate signal IS1 and second input signal QIO, and to generate first output signal S1 based on first intermediate signal IS1 and second input signal QIO. Second path 406 includes a first portion 408a, a second portion 408b and a delay circuit 408c.

First portion 408a includes a first inverter 420 coupled to a first transmission gate 422.

First inverter 420 has a first terminal 420a coupled to the third terminal 402c of NAND gate 402, and configured to receive first intermediate signal IS1. First inverter 420 has a second terminal 420b configured to generate inverted first intermediate signal IS1B.

First transmission gate 422 has an input terminal 422a coupled to the second terminal 420b of first inverter 420, and configured to receive inverted first intermediate signal IS1B. First transmission gate 422 has a control terminal 422b configured to receive inverted second input signal QIOB.

First transmission gate 422 has an inverted control terminal 422c configured to receive second input signal QIO. First transmission gate 422 has an output terminal 422d coupled to a reference node Ref A, and configured to output a signal S1' based on second input signal QIO and inverted second input signal QIOB. In some embodiments, signal S1' is equal to inverted first intermediate signal IS1B when the second transmission gate 432 is configured to pass inverted first intermediate signal IS1B (e.g., the transistors in first transmission gate 422 are turned on).

Second portion 408b includes a second inverter 430 coupled to a second transmission gate 432.

Second inverter 430 has a first terminal 430a configured to receive second input signal QIO. Second inverter 430 has a second terminal 430b configured to generate inverted second input signal QIOB.

Second transmission gate 432 has an input terminal 432a coupled to the second terminal 430b of second inverter 430, and configured to receive inverted second input signal QIOB. Second transmission gate 432 has a control terminal 432b configured to receive second input signal QIO. Second transmission gate 432 has an inverted control terminal 432c configured to receive inverted second input signal QIOB. Second transmission gate 432 has an output terminal 432d coupled to reference node Ref A, and configured to output a signal S1' based on second input signal QIO and inverted second input signal QIOB. In some embodiments, signal S1' is equal to inverted second input signal QIOB when the second transmission gate 432 is configured to pass inverted second input signal QIOB (e.g., the transistors in second transmission gate 432 are turned on).

Delay circuit 408c is coupled to first portion 408a and second portion 408b by reference node Ref A. Delay circuit 408c is configured to receive signal S1', and to output first output signal S1. First output signal S1 is a delayed version of signal V. First output signal S1 is equal to inverted second input signal QIOB or inverted first intermediate signal IS1B. Delay circuit 408c includes M inverters coupled in series, where M is an even integer equal to or greater than 2. In some embodiments, delay circuit 424 is optional.

Figure 5:
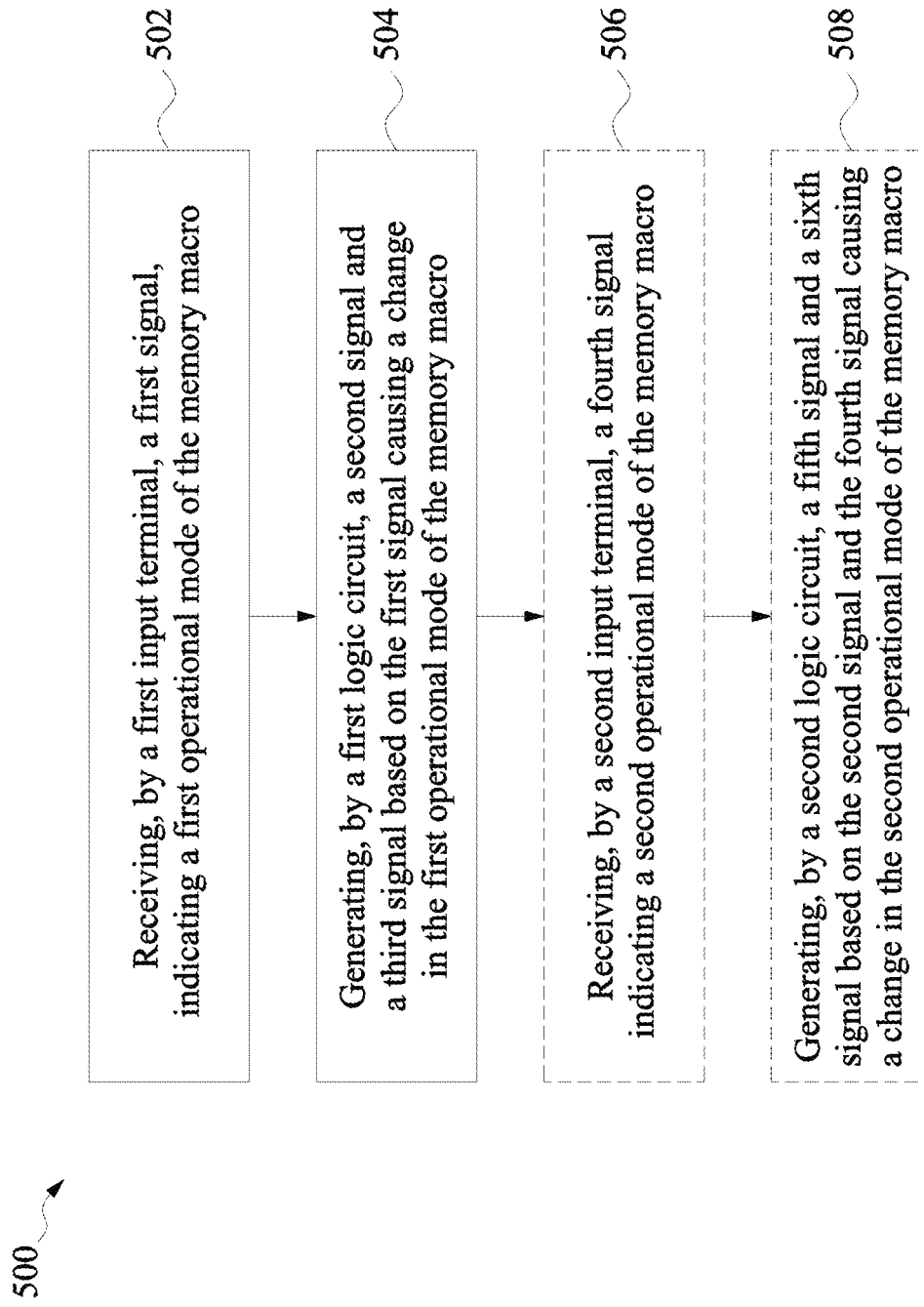
FIG. 5 is a flowchart of a method of operating a memory macro, such as the memory macro of FIG. 1A or FIG. 3A, in accordance with some embodiments.

FIG. 5 is a flowchart of a method of operating a memory macro, such as the memory macro depicted in FIG. 1A or FIG. 3A, in accordance with some embodiments. It is understood that additional operations may be performed before, during, and/or after the method 500 depicted in FIG. 5, and that some other processes may only be briefly described herein.

Method 500 begins with operation 502, where a first signal (e.g., first input signal MS (FIG. 1A)) is received by a first input terminal (e.g., first terminal 130) of the memory macro (e.g., memory macro 100 or memory macro 300). In some embodiments, first signal (e.g., first input signal MS) indicates a first operational mode of the memory macro. In some embodiments, the first operational mode of the memory macro corresponds to a first set of driver circuits (e.g., first set of word line drivers 110a, first set of word line drivers 112a or control driver circuits 120a) and a second set of driver circuits (e.g., second set of word line drivers 110b, second set of word line drivers 112b or control driver circuits 120b) being active. In some embodiments, the first operational mode of the memory macro corresponds to either the first set of driver circuits (e.g., first set of word line drivers 110a, first set of word line drivers 112a or control driver circuits 120a) or the second set of driver circuits (e.g., second set of word line drivers 110b, second set of word line drivers 112b or control driver circuits 120b) being active. In some embodiments, the first operational mode of the memory macro corresponds to the first set of driver circuits (e.g., first set of word line drivers 110a, first set of word line drivers 112a or control driver circuits 120a) being turned on, and the second set of driver circuits (e.g., second set of word line drivers 110b, second set of word line drivers 112b or control driver circuits 120b) being turned off.

Method 500 continues with operation 504, where a second signal (e.g., first signal ML or second signal MR (FIG. 1A)) and a third signal (e.g., second signal MR or first signal ML) are generated by a first logic circuit (e.g., first logic circuit 134 or first logic circuit 200) based on the first signal (e.g., first input signal MS) causing a change in the first operational mode of the memory macro (e.g., memory macro 100 or memory macro 300).

In some embodiments, the first logic circuit (e.g., first logic circuit 134 or first logic circuit 200) is coupled to a first set of driver circuits (e.g., first set of word line drivers 110a, first set of word line drivers 112a or control driver circuits 120a) and a second set of driver circuits (e.g., second set of word line drivers 110b, second set of word line drivers 112b or control driver circuits 120b). In some embodiments, the first set of driver circuits (e.g., first set of word line drivers 110a, first set of word line drivers 112a or control driver circuits 120a) are coupled to a first memory cell array (e.g., first memory cell array 104) and a first IO circuit (e.g., first IO circuit 108a), and the second set of driver circuits (e.g., second set of word line drivers 110b, second set of word line drivers 112b or control driver circuits 120b) are coupled to a second memory cell array (e.g., second memory cell array 106) and a second IO circuit (e.g., second IO circuit 108b).

In some embodiments, generating the second signal (e.g., first signal ML or second signal MR) and the third signal (e.g., second signal MR or first signal ML) based on the first signal (e.g., first input signal MS) of operation 504 includes generating a fourth signal (e.g., first signal MLB (FIG. 2)) by a first NAND gate (e.g., first NAND gate 202) based on the first signal (e.g., first input signal MS) and a first memory signal (e.g., first memory signal LSEL), generating an inverted fourth signal (e.g., first signal ML (FIG. 2)) by a first inverter (e.g., first inverter 204) based on the fourth signal (e.g., first signal MLB), generating a fifth signal (e.g., second signal MRB (FIG. 2)) by a second NAND gate (e.g., second NAND gate 206) based on the first signal (e.g., first input signal MS) and a second memory signal (e.g., second memory signal RSEL), and generating an inverted fifth signal (e.g., second signal MR (FIG. 2)) by a second inverter (e.g., second inverter 208) based on the fifth signal (e.g., second signal MRB).

In some embodiments, causing the change in the first operational mode of the memory macro (e.g., memory macro 100 or 300) of operation 504 comprises turning off or on the first set of driver circuits ((e.g., first set of word line drivers 110a, first set of word line drivers 112a and control driver circuits 120a (FIG. 1A)) based on the inverted fourth signal (e.g., first signal ML (FIG. 2)), or turning off or on the second set of driver circuits (e.g., second set of word line drivers 110b, second set of word line drivers 112b or control driver circuits 120b) (FIG. 1A)) based on the inverted fifth signal (e.g., second signal MR (FIG. 2)).

Method 500 continues with operation 506, where a second input terminal (e.g., second input terminal 320 (FIG. 3A)) receives a fourth signal (e.g., second input signal QIO) indicating a second operational mode of the memory macro. In some embodiments, the second operational mode of the memory macro corresponds to 50% of the first IO circuit or the second IO circuit being inactive. In some embodiments, operations 506 and 508 are optional. In some embodiments, the second operational mode of the memory macro corresponds to 50% of the first IO circuit being active and 100% of the second IO circuit being active, such that 75% of the IO circuits (e.g., first IO circuit and second IO circuit) are active.

Method 500 continues with operation 508, where a second logic circuit (e.g., second logic circuit 330 or second logic circuit 400) generates a fifth signal (e.g., first output signal S1 (FIG. 4)) and a sixth signal (e.g., second output signal S2) based on the second signal (e.g., first signal ML) and the fourth signal (e.g., second input signal QIO) causing a change in the second operational mode of the memory macro (e.g., memory macro 100 or memory macro 300). In some embodiments, the second logic circuit (e.g., second logic circuit 330 or second logic circuit 400) is coupled to the first IO circuit (e.g., first IO circuit 108a (FIG. 3A)) and the first logic circuit (e.g., first logic circuit 134), and the first IO circuit (e.g., first IO circuit 108a (FIG. 3A)) is coupled to the first memory cell array (e.g., first memory cell array 104).

In some embodiments, generating the fifth signal (e.g., first output signal S1 (FIG. 4)) and a sixth signal (e.g., second output signal S2) based on the second signal (e.g., first signal ML) and the fourth signal (e.g., second input signal QIO) of operation 508 includes generating a seventh signal (e.g., first intermediate signal IS1 (FIG. 4)) by a NAND gate (e.g., first NAND gate 402) based on the fourth signal (e.g., second input signal QIO) and an intermediate signal (e.g., first signal ML), outputting an inverted seventh signal (e.g., inverted first intermediate signal IS1B) by a first path (e.g., first path 404) based on the seventh signal (e.g., first intermediate signal IS1), and outputting an inverted fourth signal (e.g., inverted second input signal QIOB) or the inverted seventh signal (e.g., inverted first intermediate signal IS1B) by a second path (e.g., second path 406). In some embodiments, for operation 508, the intermediate signal (e.g., first signal ML) is based on at least the first signal (e.g., first input signal MS).

In some embodiments, for operation 508, the first path (e.g., first path 404) includes a plurality of inverters (e.g., plurality of inverters 410), and the second path (e.g., second path 406) includes a first inverter (e.g., first inverter 420 or second inverter 430) and a switch (e.g., first transmission gate 422 or second transmission gate 432).

In some embodiments, causing the change in the second operational mode of the memory macro (e.g., memory macro 100 or 300) of operation 508 comprises turning off or on a first portion (e.g., first set of IO circuits 340a (FIG. 3A)) of the first IO circuit (e.g., first IO circuit 108a) based on the inverted seventh signal (e.g., inverted first intermediate signal IS1B or second output signal S2), and turning off or on a second portion (e.g., second set of IO circuits 340b (FIG. 3A)) of the first IO circuit (e.g., first IO circuit 108a) based on the inverted fourth signal (e.g., inverted second input signal QIOB or first output signal S1) or the inverted seventh signal (e.g., inverted first intermediate signal IS1B or first output signal S1).

In some embodiments, for operation 508, the first portion (e.g., first set of IO circuits 340a (FIG. 3A)) of the first IO circuit (e.g., first IO circuit 108a) is 50% of the first IO circuit (e.g., first IO circuit 108a) and the second portion (e.g., second set of IO circuits 340b (FIG. 3A)) of the first IO circuit (e.g., first IO circuit 108a) is 50% of the first IO circuit (e.g., first IO circuit 108a).

One aspect of this description relates to a method of operating a memory macro. In some embodiments, the method includes receiving, by a first input pin of the memory macro, a first signal indicating a first operational mode of the memory macro, receiving, by a second input pin of the memory macro, a second signal indicating a second operational mode of the memory macro, generating, by a first logic circuit, a third signal and a fourth signal based on the first signal and a fifth signal thereby causing a change in the first operational mode of the memory macro, the first logic circuit being coupled to a first memory cell array and a first input output (IO) circuit, and generating, by a second logic circuit, the fifth signal and a sixth signal based on at least the second signal and thereby causing a change in the second operational mode of the memory macro, the second logic circuit being coupled to a first set of word line driver circuits and a second set of word line driver circuits, the first set of word line driver circuits being coupled to the first memory cell array, and the second set of word line driver circuits being coupled to a second memory cell array.

Another aspect of this description relates to a method of operating a memory macro. In some embodiments, the method includes receiving, by a first input pin of the memory macro, a first signal indicating a first operational mode of the memory macro, the memory macro including a first memory cell array and a second memory cell array, receiving, by a second input pin of the memory macro, a second signal indicating a second operational mode of the memory macro, generating, by a first logic circuit, a third signal and a fourth signal based on the first signal and a fifth signal thereby causing a change in the first operational mode of the memory macro, the first logic circuit being coupled to a first input output (IO) circuit by a first set of IO driver circuits and a second set of IO driver circuits, and generating, by a second logic circuit, the fifth signal and a sixth signal based on at least the second signal and thereby causing a change in the second operational mode of the memory macro, the second logic circuit being coupled to at least a third set of IO driver circuits and the second memory cell array.

Still another aspect of this description relates to a memory macro. The memory macro includes a first input pin configured to receive a first signal indicating a first operational mode of the memory macro, a second input pin configured to receive a second signal indicating a second operational mode of the memory macro, a first memory cell array, a second memory cell array, a first set of word line driver circuits coupled to the first memory cell array, a second set of word line driver circuits coupled to the second memory cell array, a first logic circuit and a second logic circuit. In some embodiments, the first logic circuit has a first terminal, a second terminal and a first output terminal. The first terminal of the first logic circuit is coupled to the first input pin and being configured to receive the first signal. The second terminal of the first logic circuit is configured to receive a third signal. The first logic circuit is configured to output at least a fourth signal, on the first output terminal, responsive to the first signal and the third signal, and causing a change in the first operational mode of the memory macro. In some embodiments, the second logic circuit has a first input terminal and a second output terminal. The first input terminal of the second logic circuit is coupled to the second input pin, and is configured to receive the second signal. The second output terminal of the second logic circuit is coupled to the second terminal of the first logic circuit, the first set of word line driver circuits and the second set of word line driver circuits. The second logic circuit is configured to generate at least the third signal responsive to the second signal causing a change in the second operational mode of the memory macro.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source. As such, the term source and drain are used interchangeably. Various signals are generated by corresponding circuits, but, for simplicity, the circuits are not shown.

Various figures show capacitive circuits using discrete capacitors for illustration. Equivalent circuitry may be used. For example, a capacitive device, circuitry or network (e.g., a combination of capacitors, capacitive elements, devices, circuitry, etc.) can be used in place of the discrete capacitor. The above illustrations include exemplary steps, but the steps are not necessarily performed in the order shown. Steps may be added, replaced, changed order, and/or eliminated as appropriate, in accordance with the spirit and scope of disclosed embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of operating a memory macro, the method comprising:
    receiving, by a first input pin of the memory macro, a first signal indicating a first operational mode of the memory macro;
    receiving, by a second input pin of the memory macro, a second signal indicating a second operational mode of the memory macro;
    generating, by a first logic circuit, a third signal and a fourth signal based on the first signal and a fifth signal thereby causing a change in the first operational mode of the memory macro, the first logic circuit being coupled to a first memory cell array and a first input output (IO) circuit; and
    generating, by a second logic circuit, the fifth signal and a sixth signal based on at least the second signal and thereby causing a change in the second operational mode of the memory macro, the second logic circuit being coupled to a first set of word line driver circuits and a second set of word line driver circuits, the first set of word line driver circuits being coupled to the first memory cell array, and the second set of word line driver circuits being coupled to a second memory cell array.

2. The method of claim 1, wherein generating the third signal and the fourth signal based on the first signal and the fifth signal comprises:
    generating, by a first NAND gate, a seventh signal based on the fifth signal and the first signal;
    outputting, by a first path, an inverted seventh signal based on the seventh signal, the inverted seventh signal being the fourth signal, the first path comprising a plurality of inverters; and
    outputting, by a second path, a delayed version of an inverted first signal or a delayed version of the inverted seventh signal, the delayed version of the inverted first signal or the delayed version of the inverted seventh signal being the third signal, the second path comprising a first inverter and a transmission gate.

3. The method of claim 2, wherein causing the change in the first operational mode of the memory macro comprises:
    turning off or on a first set of IO driver circuits coupled to a first portion of the first IO circuit based on the inverted seventh signal, the first portion of the first IO circuit corresponding to 50% of the first IO circuit.

4. The method of claim 3, wherein causing the change in the first operational mode of the memory macro further comprises:
    turning off or on a second set of IO driver circuits coupled to a second portion of the first IO circuit based on the delayed version of the inverted first signal or the delayed version of the inverted seventh signal, the second portion of the first IO circuit corresponding to 50% of the first IO circuit.

5. The method of claim 4, wherein
    data in the first portion of the first IO circuit is retained, when the first set of IO driver circuits is turned off, or
    data in the second portion of the first IO circuit is retained, when the second set of IO driver circuits is turned off.

6. The method of claim 3, wherein causing the change in the second operational mode of the memory macro comprises:
    turning off or on a third set of IO driver circuits coupled to a second IO circuit based on the sixth signal, the second logic circuit being further coupled to the second IO circuit.

7. The method of claim 6, wherein data in the second IO circuit is retained, when the third set of IO driver circuits is turned off.

8. The method of claim 1, wherein generating the fifth signal and the sixth signal based on at least the second signal comprises:
    generating, by a first NAND gate, a first NAND output signal based on the second signal and a first memory signal;
    generating, by a first inverter, an inverted first NAND output signal based on the first NAND output signal, the inverted first NAND output signal corresponding to the fifth signal;
    generating, by a second NAND gate, a second NAND output signal based on the second signal and a second memory signal; and
    generating, by a second inverter, an inverted second NAND output signal based on the second NAND output signal, the inverted second NAND output signal corresponding to the sixth signal.

9. The method of claim 8, wherein causing the change in the second operational mode of the memory macro comprises:
turning off or on the first set of word line driver circuits based on the inverted first NAND output signal; or
turning off or on the second set of word line driver circuits based on the inverted second NAND output signal.

10. The method of claim 5, wherein
data stored in the first memory cell array is retained, when the first set of word line driver circuits is turned off; or
data stored in the second memory cell array is retained, when the second set of word line driver circuits is turned off.

11. A method of operating a memory macro, the method comprising:
receiving, by a first input pin of the memory macro, a first signal indicating a first operational mode of the memory macro, the memory macro including a first memory cell array and a second memory cell array;
receiving, by a second input pin of the memory macro, a second signal indicating a second operational mode of the memory macro;
generating, by a first logic circuit, a third signal and a fourth signal based on the first signal and a fifth signal thereby causing a change in the first operational mode of the memory macro, the first logic circuit being coupled to a first input output (IO) circuit by a first set of IO driver circuits and a second set of IO driver circuits; and
generating, by a second logic circuit, the fifth signal and a sixth signal based on at least the second signal and thereby causing a change in the second operational mode of the memory macro, the second logic circuit being coupled to at least a third set of IO driver circuits and the second memory cell array.

12. The method of claim 11, wherein causing the change in the first operational mode of the memory macro comprises:
turning off or on the first set of IO driver circuits coupled to a first portion of the first IO circuit based on the third signal, the first portion of the first IO circuit corresponding to 50% of the first IO circuit.

13. The method of claim 12, wherein causing the change in the first operational mode of the memory macro further comprises:
turning off or on the second set of IO driver circuits coupled to a second portion of the first IO circuit based on the fourth signal, the second portion of the first IO circuit corresponding to 50% of the first IO circuit.

14. The method of claim 13, wherein
data in the first portion of the first IO circuit is retained, when the first set of IO driver circuits is turned off; or
data in the second portion of the first IO circuit is retained, when the second set of IO driver circuits is turned off.

15. The method of claim 12, wherein causing the change in the second operational mode of the memory macro comprises:
turning off or on the third set of IO driver circuits coupled to a second IO circuit based on the sixth signal, the second logic circuit being further coupled to the second IO circuit.

16. The method of claim 15, wherein data in the second IO circuit is retained, when the third set of IO driver circuits is turned off.

17. A memory macro comprising:
a first input pin configured to receive a first signal indicating a first operational mode of the memory macro;
a second input pin configured to receive a second signal indicating a second operational mode of the memory macro;
a first memory cell array;
a second memory cell array;
a first set of word line driver circuits coupled to the first memory cell array;
a second set of word line driver circuits coupled to the second memory cell array;
a first logic circuit having a first terminal, a second terminal and a first output terminal, the first terminal of the first logic circuit being coupled to the first input pin and being configured to receive the first signal, the second terminal of the first logic circuit being configured to receive a third signal, and the first logic circuit being configured to output at least a fourth signal, on the first output terminal, responsive to the first signal and the third signal, and causing a change in the first operational mode of the memory macro; and
a second logic circuit having a first input terminal and a second output terminal, the first input terminal of the second logic circuit being coupled to the second input pin, and being configured to receive the second signal, the second output terminal of the second logic circuit being coupled to the second terminal of the first logic circuit, the first set of word line driver circuits and the second set of word line driver circuits, the second logic circuit being configured to generate at least the third signal responsive to the second signal causing a change in the second operational mode of the memory macro.

18. The memory macro of claim 17, wherein the first logic circuit comprises:
a first NAND gate having a first terminal, a second terminal and a third terminal, the first terminal of the first NAND gate being coupled to the first input pin, and configured to receive the first signal, the second terminal of the first NAND gate being coupled to the second output terminal, and configured to receive the third signal, and the third terminal of the first NAND gate being configured to generate an inverted fourth signal;
a first set of inverters coupled to the third terminal of the first NAND gate by a first path, the first set of inverters being configured to generate the fourth signal responsive to the inverted fourth signal;
a first circuit coupled between the third terminal of the first NAND gate and a first node by a second path, the first circuit being configured to output the fourth signal responsive to at least the inverted fourth signal;
a second circuit coupled between the first input pin and the first node by a third path, the second circuit being configured to output an inverted first signal responsive to at least the first signal; and
a delay circuit coupled to the first circuit and the second circuit by the first node, and configured to output a delayed version of the fourth signal or a delayed version of the inverted first signal.

19. The memory macro of claim 18, wherein the first circuit comprises:
a first inverter having a first terminal and a second terminal, the first terminal of the first inverter being coupled to the third terminal of the first NAND gate, the second terminal of the first inverter being configured to generate the fourth signal responsive to at least the inverted fourth signal; and a first transmission gate having a first terminal, a second terminal, a third terminal, and a fourth terminal, the first terminal of the first transmission gate being coupled to the second terminal of the first inverter, the second terminal of the first transmission gate being coupled to the first node, and being configured to output the fourth signal responsive to at least the first signal and the inverted first signal, the third terminal of the first transmission gate being configured to receive the first signal, and the fourth terminal of the first transmission gate being configured to receive the inverted first signal.

20. The memory macro of claim 19, wherein the second circuit comprises:

a second inverter having a first terminal and a second terminal, the first terminal of the second inverter being coupled to the first input pin, the second terminal of the second inverter being configured to generate the inverted first signal responsive to at least the first signal; and a second transmission gate having a first terminal, a second terminal, a third terminal, and a fourth terminal, the first terminal of the second transmission gate being coupled to the second terminal of the second inverter, the second terminal of the second transmission gate being coupled to the first node and the first circuit, and being configured to output the inverted first signal responsive to at least the first signal and the inverted first signal, the third terminal of the second transmission gate being configured to receive the first signal, and the fourth terminal of the second transmission gate being configured to receive the inverted first signal; and the delay circuit comprises:

an even number of inverters coupled in series, and configured to output the delayed version of the fourth signal or the delayed version of the inverted first signal.

\* \* \* \* \*